United States Patent [19]

Wang et al.

[11] Patent Number: 5,213,650

[45] Date of Patent: May 25, 1993

[54] APPARATUS FOR REMOVING DEPOSITS FROM BACKSIDE AND END EDGE OF SEMICONDUCTOR WAFER WHILE PREVENTING REMOVAL OF MATERIALS FROM FRONT SURFACE OF WAFER

[75] Inventors: David N. Wang, Saratoga; Lawrence C. Lei; Mei Chang, both of Cupertino; Cissy Leung, Fremont, all of Calif.

[73] Assignee: Applied Materials, Inc., Santa Clara, Calif.

[21] Appl. No.: 759,319

[22] Filed: Sep. 13, 1991

Related U.S. Application Data

[62] Division of Ser. No. 398,239, Aug. 25, 1989, Pat. No. 5,075,256.

[51] Int. Cl.$^5$ .............................................. H01L 21/00
[52] U.S. Cl. .................................. 156/345; 118/723; 118/728; 118/729
[58] Field of Search ................. 156/345, 643; 118/723, 118/728, 729

[56]  References Cited

U.S. PATENT DOCUMENTS

| | | | |
|---|---|---|---|
| 3,907,660 | 9/1975 | Gillery | 204/298 |
| 4,113,599 | 9/1978 | Gillery | 204/192 P |
| 4,300,989 | 11/1981 | Chang | 204/164 |
| 4,350,562 | 9/1982 | Bonü156 | 345 X/ |
| 4,513,021 | 4/1985 | Purdes et al. | 427/38 |
| 4,534,921 | 8/1985 | Fierkens et al. | 264/39 |
| 4,624,728 | 11/1986 | Bithell et al. | 156/643 X |
| 4,664,938 | 5/1987 | Walker | 427/39 |
| 4,692,344 | 9/1987 | Kaganowicz et al. | 427/39 |
| 4,736,087 | 4/1988 | Whitlock et al. | 219/121 PG |
| 4,962,049 | 10/1990 | Chang et al. | 437/13 |
| 4,981,722 | 1/1991 | Möller et al. | 156/345 X |

FOREIGN PATENT DOCUMENTS 0308516 3/1988 European Pat. Off. .
3535900 10/1985 Fed. Rep. of Germany .

*Primary Examiner*—Thi Dang
*Attorney, Agent, or Firm*—John P. Taylor

[57] ABSTRACT

An apparatus is disclosed for removing one or more materials deposited on the backside and end edges of a semiconductor wafer which includes means for urging the front side of the wafer against a faceplate in a vacuum chamber; means for flowing one or more gases through a space maintained between the front side of the wafer and the faceplate; and means for forming a plasma in a gap maintained between the backside of the wafer and susceptor to remove materials deposited on the backside and end edge of the wafer; the gas flowing through the space between the front side of the wafer and the faceplate acting to prevent the plasma from removing materials on the front side of the wafer. In a preferred embodiment, the front side of the wafer is spaced from the faceplate by providing a generally circular recess in the faceplate having a depth corresponding to the desired spacing and having a diameter larger than the diameter of the wafer with spacing means in the recessed area to engage portions of the wafer to permit gas to flow through the recess and around the end edge of the wafer to inhibit removal of materials from the front surface of the wafer by the plasma.

9 Claims, 5 Drawing Sheets

APPARATUS FOR REMOVING DEPOSITS FROM BACKSIDE AND END EDGE OF SEMICONDUCTOR WAFER WHILE PREVENTING REMOVAL OF MATERIALS FROM FRONT SURFACE OF WAFER

This is a divisional of copending application(s) Ser. No. 07/398,239 filed on Aug. 25, 1989, now U.S. Pat. No. 5,075,256.

BACKGROUND OF THE INVENTION

1. Field of the Invention

This invention relates to a process and apparatus for removing deposits such as tungsten from the backside and end edge of a semiconductor wafer. More particularly, this invention relates to a process and apparatus for removing such deposits with a plasma etch while retaining the semiconductor wafer in a position adjacent to, but spaced from the faceplate in a plasma deposition apparatus.

2. Description of the Related Art

In the processing of a wafer or substrate in the prior art, the wafer has been spaced from a support plate at times for various reasons. For example, Gillery U.S. Pat. No. 3,907,660 teaches the cathode sputtering of a metal onto a glass substrate to form a transparent electroconductive coating. An anode plate supports a series of posts arranged in checkerboard fashion to support one or more glass sheets during the cathode sputtering.

Whitlock et al U.S. Pat. No. 4,736,087 discloses a plasma stripping apparatus for removing photoresist from a wafer. The apparatus is provide with external electrodes including a cathode located near but below the top of a reactor chamber in the apparatus and an anode located near the bottom of the chamber but above the wafer to be stripped. On the chamber base is a wafer support chuck having a plurality of quartz pins on which a wafer rests during the stripping operation.

However, in the processing of semiconductor wafers, blanket deposition of a material such as tungsten over the upper or front surface of the wafer is sometimes carried out to form patterns of the deposited material over a masked semiconductor wafer. If the rear surface of the wafer is not protected, i.e., is spaced from the support plate as described above, it will also be covered with the deposited material which may later flake off, thereby creating undesirable particles which can interfere with subsequent processing, resulting in a lowering of the yield.

To prevent such deposition on the backside of the wafer from occurring, it has been the practice to clamp or seal the wafer to the backplate or support base (susceptor) to thereby eliminate or limit exposure of the rear surface of the semiconductor wafer. However, the materials used in the blanket deposition still coat the side or end edge of the wafer as well as depositing on the clamping means or clips used to secure the wafer to the backplate. Furthermore, the use of such clamping means results in the shielding of a portion of the front surface of the wafer, thereby reducing the total area of the front surface of the wafer on which integrated circuit structures may be formed.

It has previously been proposed by one of us, in Chang et al U.S. patent application Ser. No. 337,607, now issued as U.S. Pat. No. 4,962,049, on Oct. 9, 1990 and assigned to the assignee of this invention, to use a plasma etch to remove unwanted deposits from the backside of a semiconductor wafer by raising the wafer off the susceptor or backplate a spaced distance and then forming a plasma in the gap between the wafer and the grounded susceptor to remove the deposits from the backside of the wafer. While this method will satisfactorily remove such unwanted backside deposits from the wafer, some of the materials on the front side of the wafer may also be inadvertently removed by the plasma during this removal step.

It would, therefore, be desirable to be able to remove such undesirable deposits from the backside and end edge of a semiconductor wafer while inhibiting removal of any materials from the front surface of the wafer during such a removal step.

SUMMARY OF THE INVENTION

It is, therefore, an object of this invention to provide a method and apparatus for removing, in a vacuum chamber, materials deposited on the backside and end edge of a semiconductor wafer which comprises urging the front side of the wafer against the faceplate; forming a plasma in the gap between the backside of the wafer and the susceptor to remove materials deposited on the backside and end edge of the wafer; and flowing into the chamber one or more gases through a space maintained between the wafer and the faceplate.

It is another object of this invention to provide a method and apparatus for removing, in a vacuum chamber, materials deposited on the backside and end edge of a semiconductor wafer which comprises urging the front side of the wafer against the faceplate; forming a plasma in the gap between the backside of the wafer and the susceptor to remove materials deposited on the backside and end edge of the wafer; and flowing into the chamber, through a space maintained between the wafer and the faceplate, one or more gases capable of reacting with the material deposited on the backside and end edge of the wafer.

It is yet another object of this invention to provide a method and apparatus for removing, in a vacuum chamber, materials deposited on the backside and end edge of a semiconductor wafer which comprises urging the front surface of the wafer against a portion of the faceplate; forming a plasma in the gap between the backside of the wafer and the susceptor while flowing, in a space between the front surface of the wafer and the faceplate, one or more gases capable of reacting with the material deposited on the backside and end edge of the wafer; and providing spacing means to space the front surface of the wafer from the portion of the faceplate containing openings for such gases to permit the gases to enter the space thereby created between the faceplate and the front surface of the wafer to thereby inhibit the removal of materials from the front surface of the wafer.

It is still another object of this invention to provide a method and apparatus for removing, in a vacuum chamber, materials deposited on the backside and end edge of a semiconductor wafer which comprises urging the front surface of the wafer against a faceplate having a recessed central portion containing gas passage openings to thereby create a space between the faceplate and the front surface of the wafer; forming a plasma in the gap between the backside of the wafer and the susceptor; flowing, through the gas passage openings in the recessed portion of the faceplate, one or more gases capable of reacting with the material deposited on the backside and end edge of the wafer; and providing spacing means to space the front surface of the wafer from the recessed portion of the faceplate to permit the gases to enter the space thereby created between the faceplate and the front surface of the wafer.

It is a further object of this invention to provide a method and apparatus for removing, in a vacuum chamber, materials deposited on the backside and end edge of a semiconductor wafer which comprises urging the front surface of the wafer against a faceplate having a recessed central portion containing gas passage openings to thereby create a space between the faceplate and the front surface of the wafer, the recessed central portion being of larger diameter than the wafer to permit flow of the gas entering the recessed central portion through the gas passage openings to flow around the end edges of the wafer to thereby inhibit removal of materials from the front surface of the wafer; forming a plasma in the gap between the backside of the wafer and the susceptor; flowing, through the gas passage openings in the recessed portion of the faceplate, one or more gases capable of reacting with the material deposited on the backside and end edge of the wafer; and providing spacing means to space the front surface of the wafer from the recessed portion of the faceplate to permit the gases to enter the space created between the faceplate and the front surface of the wafer.

These and other objects of the invention will be apparent from the following description and accompanying drawings.

DETAILED DESCRIPTION OF THE INVENTION

Figure 1:
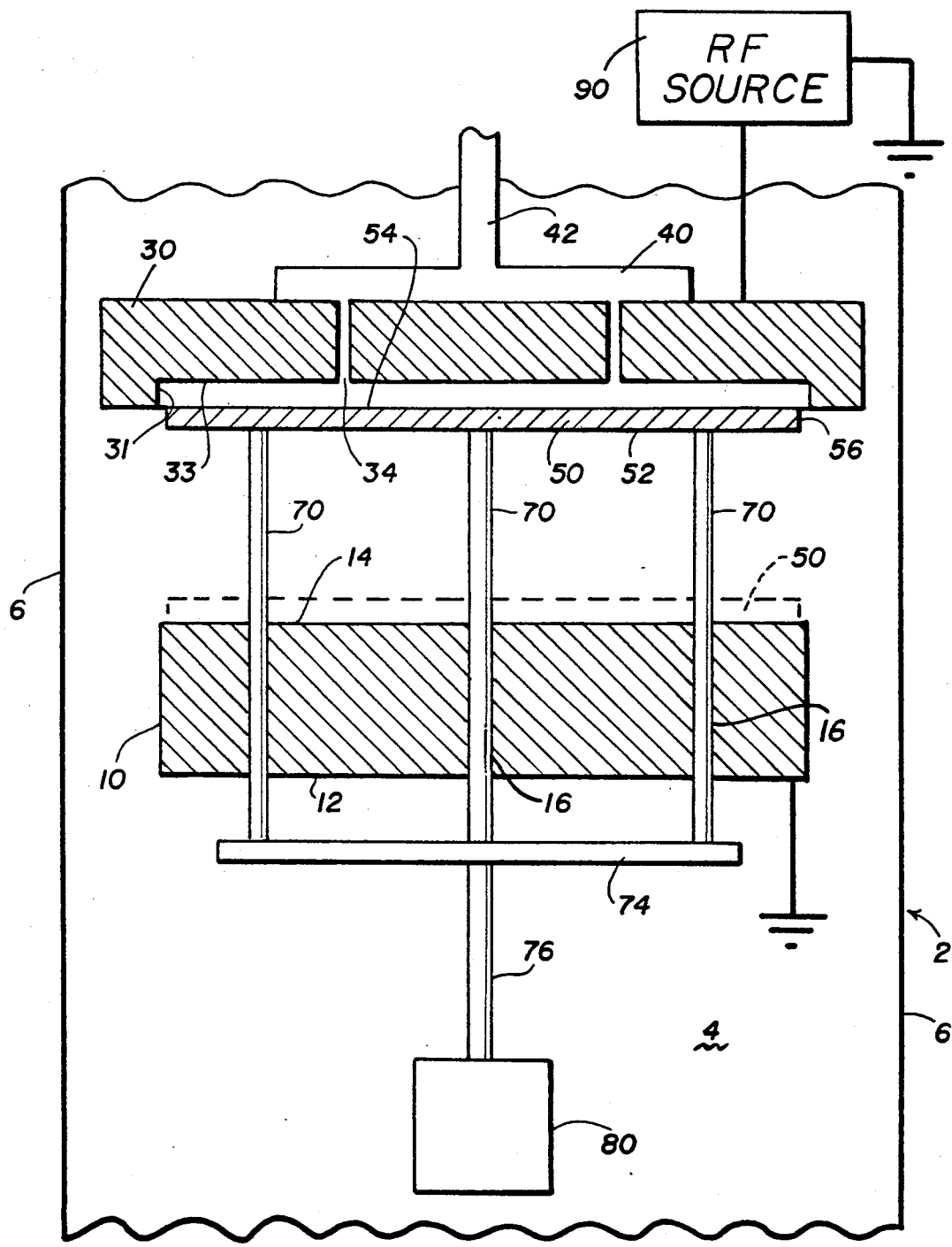
FIG. 1 is a fragmentary vertical cross-sectional view of the apparatus used to remove deposits from the rear surface of a semiconductor wafer.

Turning now to FIG. 1, vacuum apparatus is generally shown at 2 which can be used in the practice of the invention to remove deposits from the rear surface 52 of a semiconductor wafer 50 while preventing inadvertent removal of material from the front side or front surface 54 of wafer 50. Vacuum apparatus 2 includes a vacuum processing chamber 4 surrounded by a chamber wall 6 and conventionally evacuated by a pump means (not shown).

By the terms "backside" or "back surface" of wafer 50 is meant the surface of wafer 50 which has not been subject to a fine finish or polish and on or in which the construction of integrated circuit structures has not been made.

By the terms "front side" or "front surface" of wafer 50 is meant that surface of wafer 50 which has been given a fine finish polish and on or in which have been or will be constructed integrated circuit structures.

By the term "end edge" is meant the vertical or rounded edge surfaces of the wafer generally perpendicular to the planar surfaces of the wafer, i.e., the front side and backside of the wafer.

Located within vacuum chamber 4 is a grounded support plate or backplate 10, sometimes also referred to as a susceptor in a plasma-assisted chemical vacuum deposition (CVD) process, and a faceplate or "showerhead" 30 which is connected to an rf power source 90. Faceplate 30, in accordance with the invention, is sized to a particular diameter wafer for reasons which will be more fully explained below.

Processing gas passes through faceplate 30 into chamber 4 through openings 34 in the front surface of faceplate 30 which faces susceptor 10. Openings 34 may, in turn, be in communication with a plenum 40 connected to an external source (or sources) of gas (not shown) through conduit 42.

The front surface of susceptor 10, in accordance with the invention, is sized to approximate the size of wafer 50, so that when wafer 50 is supported thereon during a normal deposition (as can be seen by the dotted lines in FIG. 1), very little of the front surface of susceptor 10 will be exposed, thus reducing the amount of deposits on susceptor 10 which must be removed during the cleaning process. Preferably, the diameter of susceptor 10 exceeds the diameter of wafer 50 by not more than about 5.08 millimeters (mm).

Susceptor or backplate 10 is further provided with a plurality of openings or bores 16 therein which pass from the backside 12 of susceptor 10 to the front or top surface 14 thereof. Mounted within bores 16 are removal pins 70 which may be connected by a common plate 74, beneath susceptor 10, to a common shaft 76 connected to lowering and raising means 80 such as a fluid power cylinder or a motor. Raising means 80 may be used to raise or lower shaft 76, plate 74, and pins 70 when it is desired to either lower wafer 50 onto top surface 14 of susceptor 10, e.g., prior to a deposition step, or to raise Wafer 50 from surface 14 after the deposition.

In accordance with the practice of the present invention, pins 70 are also used to urge front surface or face 54 of wafer 50 against faceplate 30 during a cleaning or stripping step after the deposition step to remove unwanted deposits from rear surface 52 of wafer 50 as well as to remove deposits from susceptor 10 and other exposed surfaces within vacuum chamber 4.

While pins 70 urge front surface 54 of wafer 50 against faceplate 30, a plasma is ignited in the gap formed between rear surface 52 of wafer 50 and top surface 14 of susceptor 10. One or more gases, including process gases capable of forming fluorine radicals, are then fed into chamber 4 through openings 34 in faceplate 30 to react with the deposits as will be explained in more detail below.

To effectively remove such undesirable deposits, without, however, damaging front surface 54 of wafer 50 on which integrated circuit structures are in the process of being formed, it is important that front surface 54 of wafer 50 be protected from this plasma.

In accordance with the invention, front surface 54 of wafer 50 is protected from the plasma-assisted etchant materials by spacing wafer 50 a predetermined distance from faceplate 30 and then flowing the incoming gases used in the plasma through the resultant gap or space formed between front surface 54 of wafer 50 and faceplate 30. This is accomplished by modifying faceplate 30 so that when pins 70 urge front surface 54 of wafer 50 against faceplate 30, the desired gap between wafer 50 and faceplate 30 will always be formed with the same spacing.

Figure 2:
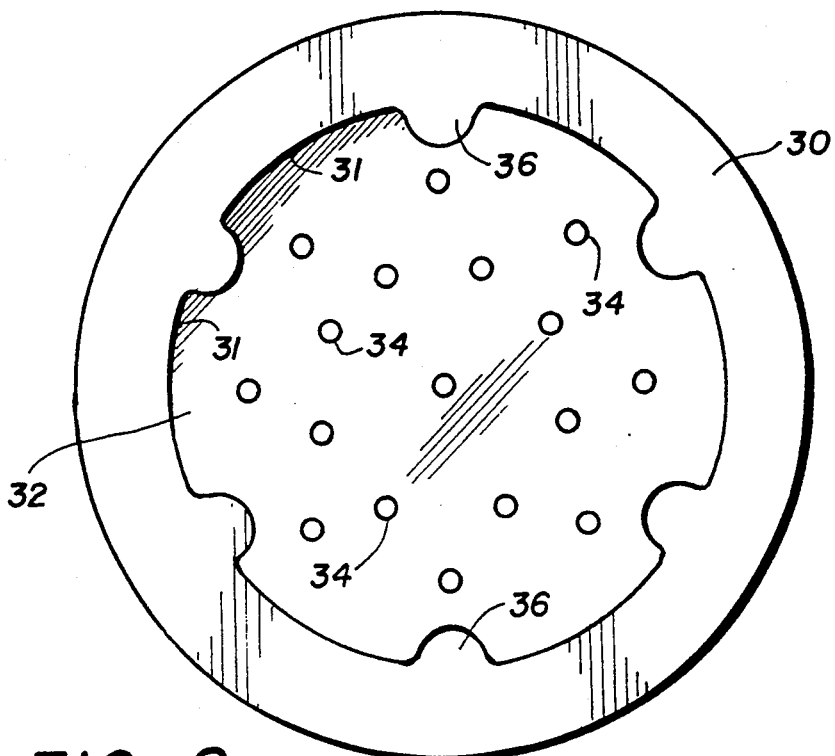
FIG. 2 is a plan view of the modified faceplate of the invention as viewed from below.
Figure 3:
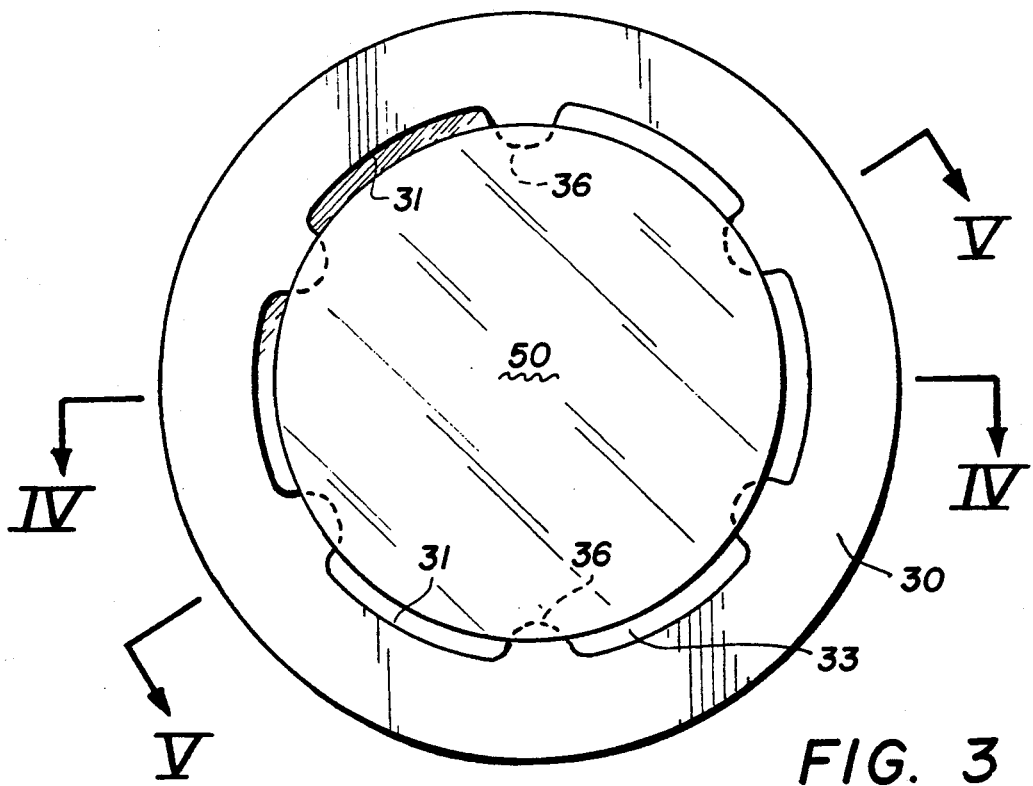
FIG. 3 is a plan view of the modified face plate shown in FIG. 2 with a semiconductor wafer shown being urged against the faceplate.
Figure 4:
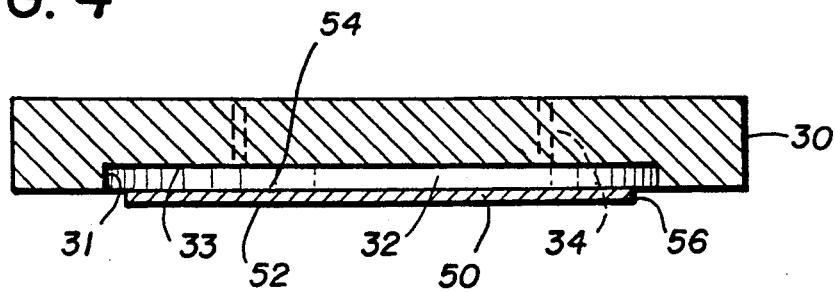
FIG. 4 is a vertical cross-sectional view of the faceplate and wafer of FIG. 3 taken along lines IV—IV showing the gap between the end edge of the wafer and the faceplate in a recessed region where the faceplate does not support the edge of the wafer.

Turning now to FIGS. 2-5, the bottom face of faceplate 30 is formed with a generally circular recessed central portion 32 having a diameter slightly larger than the diameter of of wafer 50, as best seen in FIGS. 3 and 4. It will, therefore, be understood that a different faceplate will be used for each size of wafer to be processed.

Recessed central portion 32 of faceplate 30 has a depth of from about 0.127 mm to about 0.508 mm (about 0.005" to about 0.020"), preferably from about 0.23 mm to about 0.28 mm (about 0.009" to about 0.11"), and most preferably about 0.254 mm (0.010") to provide a gap of that dimension between front surface 54 of wafer 50 and the recessed top surface 33 (FIGS. 4 and 5) of central portion 32.

To space wafer 50 from top surface 33 of recessed portion 32 of faceplate 30, segments 36 are provided on faceplate 30 which protrude into recessed portion 32. In other words, while recessed portion 32 is generally circular, as seen in FIGS. 2 and 3, segments 36 of faceplate 30 are not cut away when recessed portion 32 is formed. Segments 36, therefore, laterally protrude into recessed portion 32 sufficiently to provide a distance between opposite segments 36 which is less than the diameter of wafer 50. Therefore, when pins 70 are used to urge wafer 50 against faceplate 30, front surface 54 of wafer 50 will rest on segments 36, as shown in FIG. 3, i.e., maintaining front surface 54 of wafer 50 in the plane of the unrecessed surface of faceplate 30.

Figure 5:
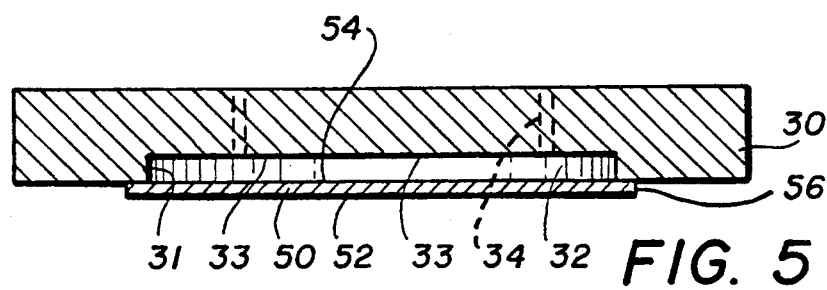
FIG. 5 is a vertical cross-sectional view of the faceplate and wafer of FIG. 3 taken along lines V—V to show a unrecessed region of the faceplate where the edge of the wafer is supported.

This reproducibly forms the desired space between upper surface 54 on wafer 50 and recessed top surface 33 of faceplate 30 shown in FIGS. 4 and 5. Usually segments 36 laterally protrude into recessed portion 32, from the circle which generally circumscribes portion 32, a distance of from about 2.3 to about 2.54 mm (about 0.90" to about 0.10"). At least 3 such segments 36 should be symmetrically spaced around the periphery of recessed portion 32, about 4 to 8 of such segments being preferred, to provide adequate support for wafer 50. Most preferably, the lateral positioning of segments 36 in faceplate 30 will match the positioning of pins 70 in susceptor 10 to minimize the creation of stress in wafer 50.

As discussed above, the general diameter of recessed portion 32 is larger than the diameter of wafer 50, thus creating a gap between the sidewall 31 of recessed portion 32 and end edge 56 of wafer 50 (as shown in FIGS. 3 and 4) except in those areas where segments 36 protrude laterally into recessed portion 32.

While wafer 50 may not always be perfectly aligned concentrically with recessed portion 32, the gap formed between end edge 56 of wafer 50 and sidewall 31 of recessed portion 32 will generally average from about 1.27 mm to about 1.52 mm (about 0.05" to about 0.06") to provide for passage of gases from openings 34 which flow into the gap between front surface 54 of wafer 50 and recessed portion 32 to flow around end edge 56 of wafer 50 and into chamber 4.

As stated earlier, the one or more gases flowing into chamber 4 include any process gases capable of generating fluorine radicals which will then react with the coating materials on wafer 50 and other exposed surfaces of chamber 4 to thereby remove such unwanted deposits. Examples of such process gases include $NF_3$, $SF_6$, $CF_4$, and $C_2F_6$. When more than one gas is flowing into chamber 4, the mixture of gases may further include inert or non-reactive gases such as argon, neon, or helium.

The flow rate of such gases, which are flowed into chamber 4 through openings 34 in faceplate 30 and through the gap created between end wall 31 of recess 32 and end edge 56 of wafer 50, may vary slightly with the volume of chamber 4 and will vary with the area of the wafer. The flow rate of the gase will generally be within a range from about 50 to about 300 sccm. With this amount of gas flow and this spacing between wafer 50 and faceplate 30, the plasma formed in the space between bottom surface 52 of wafer 50 and upper surface 14 of susceptor 10 will not result in removal of any of the materials from front surface 54 of wafer 50 in accordance with the invention. While the gases are flowing into vacuum chamber 4, a plasma is ignited between the back surface 52 of wafer 50 and top surface 14 of susceptor 10 using conventional rf power generation equipment 90. The power level of the plasma should be maintained within a range of from about 200 to about 800 watts, depending upon the area of the wafer, during the removal of the deposits from rear surface 52 of wafer 50. For example, using a 150 mm (6") diameter wafer, a power level of about 350 to 450 watts can be satisfactorily used.

In accordance with the invention, the process is carried out for a period within a range of from about 30 seconds to about 5 minutes, preferably within a range of from about 30 seconds to about 2 minutes. Usually the process is run for at least about 1 minute because the deposits on the surfaces in chamber 4, other than on wafer 50, usually consume much of the process gas as it flows into chamber 4. The time period and the power level of the plasma are related with longer time periods needed with lower power levels.

The cleaning process is usually carried out while maintaining a pressure within a range of from about 0.1 Torr to about 1 Torr, typically about 0.5 Torr, and at a susceptor temperature within a range of from about 450° C. to about 500° C., typically about 475° C.

Figure 6:
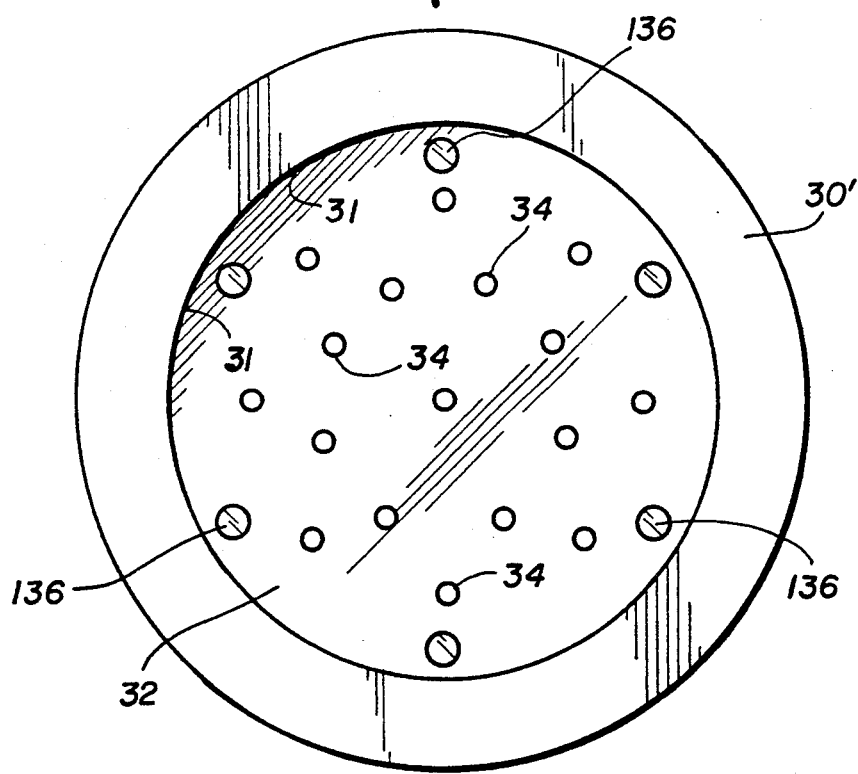
FIG. 6 is a plan view of another embodiment of the modified faceplate of the invention as viewed from below wherein the portions on the faceplate which space the front surface of the wafer from the recessed portion of the faceplate are not contiguous with the remaining unrecessed portion of the surface of the faceplate to permit gases to flow around all 360° of the end edges of the wafer.
Figure 7:
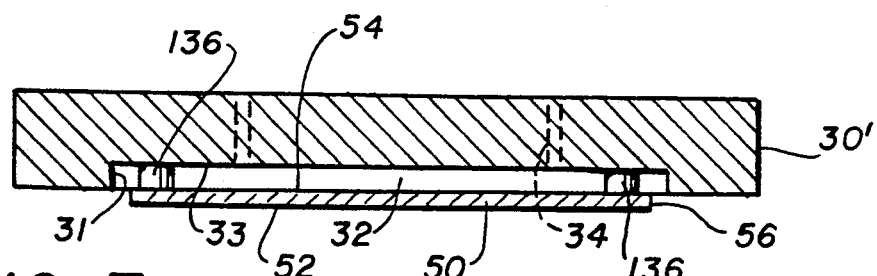
FIG. 7 is a vertical cross-sectional view of the embodiment of FIG. 6 taken along lines VII—VII.

FIGS. 6 and 7 show another embodiment of the invention wherein protrusions 36 are replaced by spacer members 136 on faceplate 30' which act to space wafer 50 from the bottom surface of faceplate 30', but which, unlike protrusions 36, are not contiguous with the remainder of the unrecessed surface of faceplate 30'. In this embodiment, the gases flowing in recess 32 between the front surface of wafer 50 and faceplate 30 may flow around all 360° of end edge 56 of wafer 50 to remove deposited materials on such end edge of wafer 50.

Spacer members 136 in this embodiment space wafer 50 from the top surface 33 of recess 32 in faceplate 30 the same distance as in the previous embodiment, i.e., from about 0.127 mm to about 0.508 mm (about 0.005" to about 0.020"), preferably from about 0.23 mm to about 0.28 mm (about 0.009" to about 0.11"), and most preferably about 0.254 mm (0.010").

Figure 8:
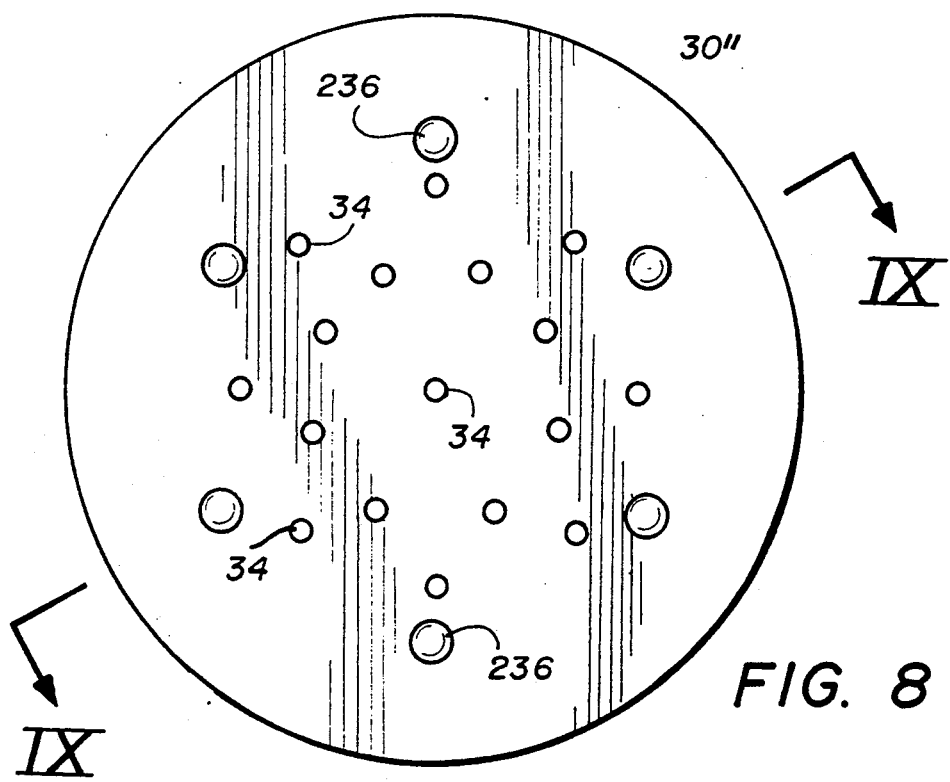
FIG. 8 is a plan view of Yet another embodiment of the modified faceplate of the invention as viewed from below wherein raised portions on the faceplate space the front surface of the wafer from the surface of the faceplate to permit the gases to flow out of the faceplate into the space between the faceplate and the front surface of the wafer.
Figure 9:
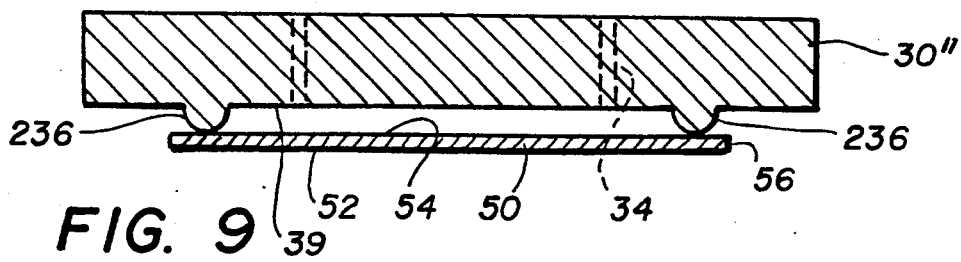
FIG. 9 is a vertical cross-sectional view of the embodiment of FIG. 8 taken along lines IX—IX.
Figure 10:
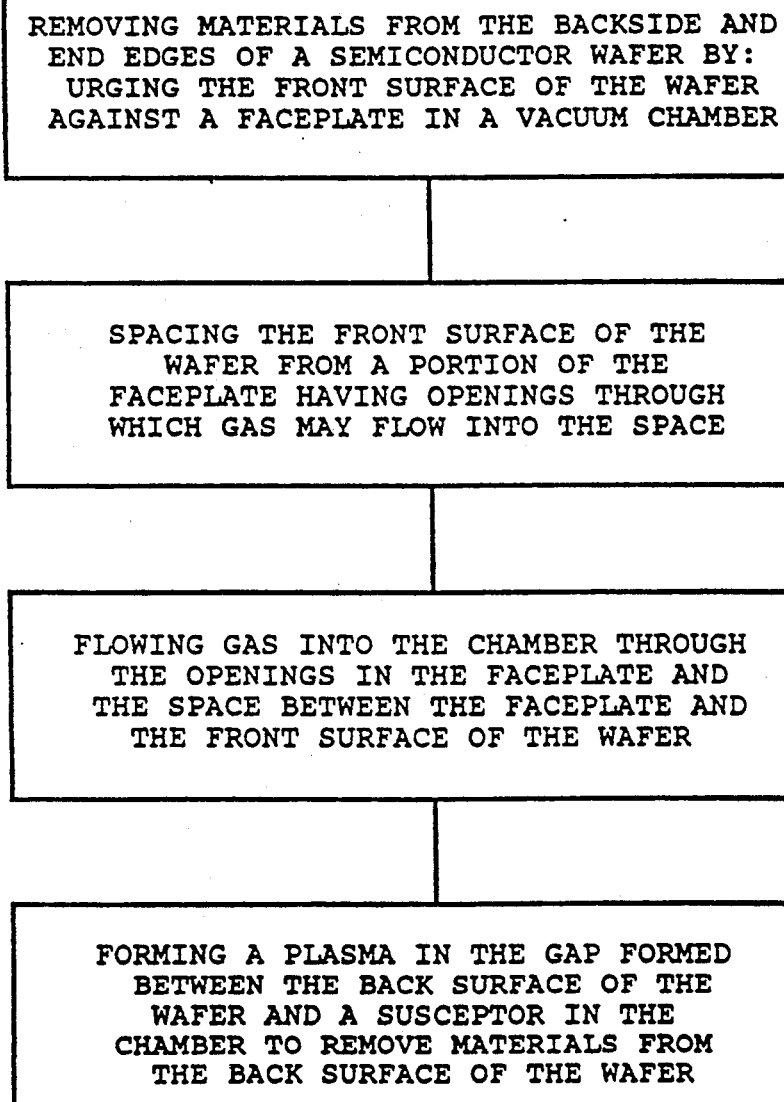
FIG. 10 is a flowsheet illustrating the process of the invention.

FIGS. 8 and 9 show yet another embodiment of the invention wherein faceplate 30" is not recessed but rather has raised spacers 236 which space wafer 50 from the bottom surface of faceplate 30" the same distance as between wafer 50 and top surface 33 of recessed portion 32 in the previous embodiments, i.e., from about 0.127 mm to about 0.508 mm (about 0.005" to about 0.020"), preferably from about 0.23 mm to about 0.28 mm (about 0.009" to about 0.11"), and most preferably about 0.254 mm (0.010").

As in the previous embodiments, process gas enters the gap between front surface 54 of wafer 50 and surface 39 of faceplate 30" through openings 34 and this process gas then flows around the end edge 56 of wafer 50 into the plasma in chamber 4 between rear surface 52 of wafer 50 and the top surface 14 of susceptor 10.

To further illustrate the operation of the process and apparatus of the invention, a 150 mm diameter silicon wafer was blanket deposited with a 1 micron coating layer of tungsten in a 6 liter plasma-assisted CVD deposition chamber wherein the susceptor was about 157 mm (6.185") in diameter, i.e., only slightly larger in diameter than the diameter of the silicon wafer.

After the deposition, the process of the invention for removal of undesired deposits on the backside and end edge of the wafer, as well as other exposed surfaces of the vacuum chamber, was carried out. Ejection pins located in vertical bores in the susceptor, were raised to urge the coated wafer against the faceplate. The surface of the faceplate facing the wafer was formed with a generally circular central recess having a depth of about 0.254 mm and a diameter of about 153 mm (6.016") Symmetrically spaced about the perimeter of the recessed portion of the faceplate were six segments of the faceplate which were not recessed and which protruded into the recessed portions by about 2.29 mm to thereby support the wafer as the pins pressed the wafer against the faceplate.

While maintaining the silicon wafer against the faceplate, about 150 cc/min of $NF_3$ gas was admitted into the vacuum chamber through holes in the top of the recessed portion of the faceplate so that the gas flowed in the gap formed between the faceplate and the wafer by the recess and then around the end edge of the wafer. During the removal process the temperature of the susceptor was maintained at 475° C. and the pressure in the chamber was 0.5 Torr.

A plasma was ignited in the gap between the back surface of the wafer and the top surface of the susceptor at a power level of 400 watts. The plasma and gas flow were maintained for about 1 minute. The wafer was then removed from the vacuum chamber and examined. Visual and SEM inspection revealed no remaining deposits on the backside of the wafer except where the pins had been in contact with the wafer. Inspection of the front surface of the wafer by SEM revealed no ascertainable removal of materials.

Thus, the invention provides a novel process and apparatus for the removal of undesirable deposits from the end edge and backside or rear surface of a semiconductor wafer without risking damage to the front surface of the wafer by inadvertent removal of coating materials from the front surface by portions of the plasma extending around the end edges of the wafer. By maintaining a gap of selected distance between the front surface of the wafer and the faceplate, and by maintaining a flow of gas through this gap, the plasma is prevented from extending around to the front surface of the wafer.

Having thus described the invention, what is claimed is:

1. Apparatus including a vacuum chamber for removing one or more materials deposited on the back surface and end edge of a semiconductor wafer without removal of material from the front surface of said wafer which comprises:
   (a) a wafer support member adjacent the bottom of said vacuum chamber having an upper surface thereon to receive a wafer to be processed in said chamber;
   (b) a faceplate adjacent the top of said vacuum chamber having a first surface thereon facing said upper surface of said wafer support member;
   c) means for raising said wafer in said chamber off said wafer support member and into contact with portions of said first surface of said faceplate in said chamber, to permit removal of materials from said back surface of said wafer, and for lowering said wafer back onto said wafer support to permit normal processing of said front surface of said wafer in said chamber;
   (d) spacing means associated with said first surface of said faceplate to form a space between said front surface of said wafer and a portion of said faceplate containing openings for gases to enter said chamber;
   (e) means for flowing one or more gases through said space formed between said front surface of said wafer and said faceplate; and
   (d) means for forming a plasma in said chamber, in the gap formed between said back surface of said wafer and said wafer support member by said means for raising said wafer into contact with said faceplate, to remove materials deposited on said back surface and end edge of said wafer;
   whereby materials may be removed from said back surface of said wafer while said gases flowing through said space between said front surface of said wafer and said faceplate prevent said plasma from removing materials on said front surface of said wafer.

2. The apparatus of claim 1 wherein said spacing means to form a space between said front surface of said wafer and a portion of said faceplate containing openings for gases to enter said chamber further comprise: (a) a generally circular recess formed in a surface of said faceplate facing said front surface of said wafer having a diameter larger than said wafer; and (b) spacer segments in said recess to engage said front surface of said wafer to maintain the front surface of said wafer in the plane of the unrecessed portion of said faceplate to thereby create a space between said front surface of said wafer and the bottom of said recess through which gases may flow.

3. The apparatus of claim 2 wherein said means for flowing one or more gases through said space maintained between said front surface of said wafer and said faceplate comprise openings in said faceplate leading to said recess in said faceplate.

4. The apparatus of claim 1 said space between said front surface of said wafer and said faceplate is within a range of from about from about 0.127 mm to about 0.508 mm.

5. The apparatus of claim 1 wherein the gap between the end edge of said wafer and the sidewall of said recess averages from about 1.27 to about 1.52 mm to provide for passage of gases from said space between said faceplate and the front surface of said wafer to pass into said chamber.

6. The apparatus of claim 1 wherein said spacing means to form a space between said front surface of said wafer and a portion of said faceplate containing openings for gases to enter said chamber further comprise raised portions on the surface of said faceplate facing said front surface of said wafer.

7. The apparatus of claim 1 wherein said means for raising said wafer into contact with said faceplate in said chamber comprise ejection pin means in said wafer support member.

8. Plasma deposition apparatus, including a vacuum chamber containing a faceplate adjacent an upper portion of said chamber; and a susceptor, adjacent a bottom portion of said chamber and normally used to support a wafer thereon during a plasma-assisted chemical vapor deposition, adapted for removing one or more materials previously deposited on the back surface and end edge of a semiconductor wafer, which comprises:
    (a) ejection pin means in susceptor in said vacuum chamber adapted to raise said wafer sufficiently to urge the front surface of said wafer against portions of a lower surface of said faceplate facing said susceptor in said chamber and to lower said wafer back onto said susceptor for processing of said front surface of said wafer;
    (b) spacing means on said lower surface of said faceplate to form a space between said front surface of said wafer and said faceplate comprising:
        (i) a recess formed in said lower surface of said faceplate facing said front surface of said wafer having a diameter larger than said wafer; and
        (ii) unrecessed spacer portions in said recess to engage said front surface of said wafer to maintain the front surface of said wafer in the plane of the unrecessed portion of said lower surface of said faceplate to thereby create a space between said front surface of said wafer and the bottom of said recess through which one or more gases may flow;
    (c) means comprising openings in said recess in said faceplate to permit said one or more gases to enter the space created by said recesses between said faceplate and the front surface of said wafer and to flow from said space into said chamber; and
    (d) means for forming a plasma in a gap maintained between said back surface of said wafer and said susceptor in said chamber to remove materials deposited on said back surface and end edge of said wafer;

wherein said flow of said one or more gases through said recess in said faceplate into said chamber prevent said plasma from removing materials on said front surface of said wafer while said material is being removed from said back surface of said wafer.

9. Vacuum apparatus capable of processing the front surface of a semiconductor wafer in a first position and also capable of moving said wafer to a second position for removing one or more materials deposited on the back surface and end edge of said wafer without removal of material from said front surface of said wafer which comprises:
    (a) a vacuum chamber containing a susceptor adjacent the bottom of said chamber having an upper surface thereon to receive a wafer to be processed in said chamber, and a faceplate adjacent the top of said chamber having a first surface facing said susceptor;
    (b) pin means carried by said susceptor for raising said wafer in said chamber off said susceptor and into contact with portions of said first surface of said faceplate in said chamber, to permit removal of materials from said back surface of said wafer, and for lowering said wafer back onto said susceptor to permit normal processing of said front surface of said wafer in said chamber;
    (c) recess means in said first surface of said faceplate having a width exceeding the diameter of said wafer;
    (d) spacing means associated with said first surface of said faceplate to provide a space between said front surface of said wafer and said recess means in said first surface of said faceplate;
    (e) means for flowing one or more gases into said recess means whereby said gases will flow through said space formed between said front surface of said wafer and said faceplate and around said end edge of said wafer into the remainder of said vacuum chamber; and
    (f) means for forming a plasma in said chamber, in the gap formed between said back surface of said wafer and said susceptor when said wafer is raised into contact with said faceplate, to remove materials deposited on said back surface and end edge of said wafer;

whereby materials may be removed from said back surface of said wafer while said gases flowing through said space between said front surface of said wafer and said faceplate prevent said plasma from removing materials on said front surface of said wafer.

* * * * *